(12) United States Patent
Tan et al.

(10) Patent No.: US 10,666,240 B2
(45) Date of Patent: May 26, 2020

(54) DEVICES, METHODS FOR CONTROLLING A DEVICE, AND COMPUTER-READABLE MEDIA

(71) Applicant: RAZER (ASIA-PACIFIC) PTE. LTD., Singapore (SG)

(72) Inventors: Min-Liang Tan, Singapore (SG); Sreenath Unnikrishnan, Singapore (SG); Kheng Joo Khaw, Singapore (SG)

(73) Assignee: RAZER (ASIA-PACIFIC) PTE. LTD., Singapore (SG)

( * ) Notice: Subject to any disclaimer, the term of this patent is extended or adjusted under 35 U.S.C. 154(b) by 0 days.

(21) Appl. No.: 16/308,734

(22) PCT Filed: Jun. 28, 2016

(86) PCT No.: PCT/SG2016/050300
§ 371 (c)(1),
(2) Date: Dec. 10, 2018

(87) PCT Pub. No.: WO2018/004451
PCT Pub. Date: Jan. 4, 2018

(65) Prior Publication Data
US 2019/0158079 A1    May 23, 2019

(51) Int. Cl.
*H01H 9/54* (2006.01)
*H03K 5/1254* (2006.01)
*H01H 13/803* (2006.01)

(52) U.S. Cl.
CPC ............ *H03K 5/1254* (2013.01); *H01H 9/54* (2013.01); *H01H 13/803* (2013.01); *H01H 2239/03* (2013.01); *H01H 2300/052* (2013.01)

(58) Field of Classification Search
CPC .................................................. H03K 5/1254
See application file for complete search history.

(56) References Cited

U.S. PATENT DOCUMENTS

| 4,581,603 A | 4/1986 | Ingold et al. |
| 5,315,539 A | 5/1994 | Hawes |
| 6,639,425 B2 | 10/2003 | Yazdy |
| 7,579,894 B2 * | 8/2009 | Kejriwal ............. H03K 5/1252 327/34 |

(Continued)

FOREIGN PATENT DOCUMENTS

WO    WO 2012/008629 A1    1/2012

OTHER PUBLICATIONS

International Search Report and Written Opinion, dated Mar. 28, 2017, for the corresponding International Application No. PCT/SG2016/050300 in 11 pages.

(Continued)

*Primary Examiner* — Hai L Nguyen
(74) *Attorney, Agent, or Firm* — Polsinelli PC

(57) ABSTRACT

A device having a memory configured to store information indicating debounce times for the device's switches and having circuits configured to determine whether the switches are depressed and closed based on the debounce times. The debounce times are updated based on the age of the device and/or switch usage. The method for debouncing may be performed by a computer having computer-readable media directed to adjusting the debounce times based on the age of the device containing the switches.

16 Claims, 1 Drawing Sheet

(56) References Cited

U.S. PATENT DOCUMENTS

| | | |
|---|---|---|
| 7,786,901 B2 | 8/2010 | Alberth, Jr. et al. |
| 8,631,290 B2 | 1/2014 | Zandian et al. |
| 9,125,278 B2 | 9/2015 | Nathan |
| 9,262,182 B2 | 2/2016 | Mullens et al. |
| 2007/0236257 A1 | 10/2007 | Kejriwal |
| 2008/0159440 A1 | 7/2008 | Jaffer et al. |
| 2008/0297205 A1 | 12/2008 | Taylor |
| 2011/0291799 A1 | 12/2011 | Girard, III et al. |
| 2013/0113395 A1 | 5/2013 | Sulaiman et al. |
| 2013/0127517 A1 | 5/2013 | Chen |
| 2015/0077341 A1 | 3/2015 | Hood, III |

OTHER PUBLICATIONS

Extended European Search Report, dated Jun. 4, 2019, for the corresponding European Application No. 16907482.0 in 8 pages.

* cited by examiner

DEVICES, METHODS FOR CONTROLLING A DEVICE, AND COMPUTER-READABLE MEDIA

TECHNICAL FIELD

Various embodiments generally relate to devices, methods for controlling a device, and computer-readable media.

BACKGROUND

Contact bounce (which may also be called chatter) is a common problem faced by mechanical switches. This problem occurs when the two end points of a switch come into repeated contact after being opened once (because of their momentum and elasticity), causing repeated and unintended actuation within a short period of time. There may be a need to avoid problems associated with contact bounce.

SUMMARY OF THE INVENTION

According to various embodiments, a device may be provided. The device may include: a switch; a memory configured to store information indicating a debounce time; a switch closed determination circuit configured to determine whether the switch is depressed based on the debounce time; and an age compensation circuit configured to update the debounce time based on an age of the device.

According to various embodiments, a method for controlling a device may be provided. The method may include: storing information indicating a debounce time; determining whether a switch of the device is depressed based on the debounce time; and updating the debounce time based on an age of the device.

According to various embodiments, a computer-readable medium may be provided. The computer-readable medium may include instructions which, when executed by a computer, make the computer perform a method for controlling a device. The method may include: storing information indicating a debounce time; determining whether a switch of the device is depressed based on the debounce time; and updating the debounce time based on an age of the device.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. The dimensions of the various features or elements may be arbitrarily expanded or reduced for clarity. In the following description, various embodiments of the invention are described with reference to the following drawings, in which.

DETAILED DESCRIPTION

Figure 1:
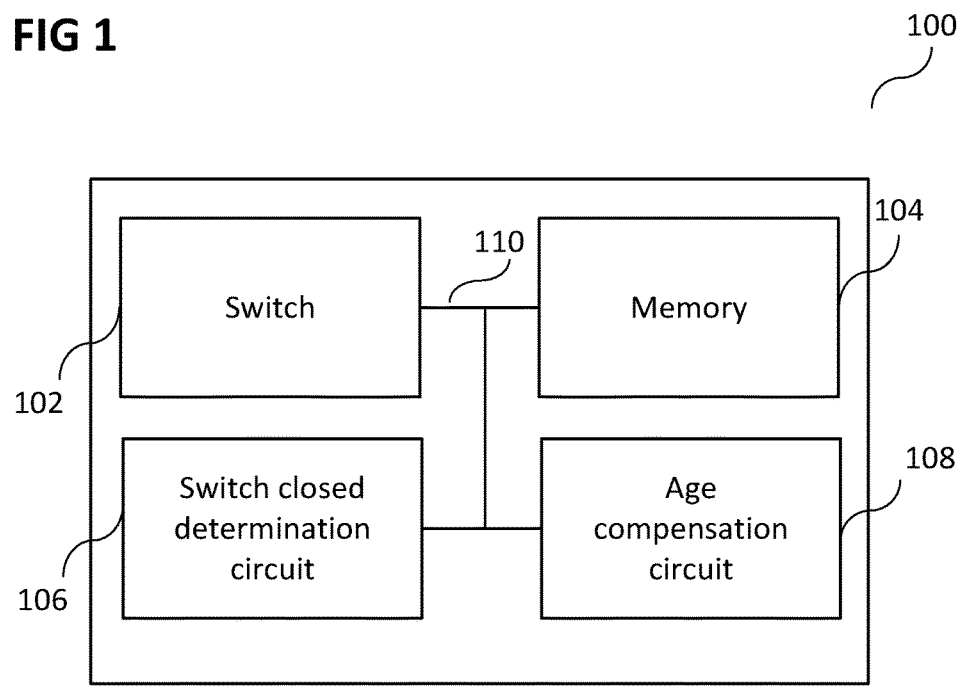
FIG. 1 shows a device according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In this context, the device as described in this description may include a memory which is for example used in the processing carried out in the device. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

In the specification the term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

The reference to any prior art in this specification is not, and should not be taken as an acknowledgement or any form of suggestion that the referenced prior art forms part of the common general knowledge in Australia (or any other country).

In order that the invention may be readily understood and put into practical effect, particular embodiments will now be described by way of examples and not limitations, and with reference to the figures.

Various embodiments are provided for devices, and various embodiments are provided for methods. It will be understood that basic properties of the devices also hold for the methods and vice versa. Therefore, for sake of brevity, duplicate description of such properties may be omitted.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

Contact bounce (which may also be called chatter) is a common problem faced by mechanical switches. This problem occurs when the two end points of a switch come into repeated contact after being opened once (because of their momentum and elasticity), causing repeated and unintended actuation within a short period of time.

According to various embodiments, devices and methods are provided which may avoid problems associated with contact bounce.

Debouncing may provide mitigation of this problem through firmware, software or mechanical means.

When implemented through firmware or software, debouncing may be done by specifying a time (for example lesser than 100 ms), below which multiple switch activations are ignored.

The contact bounce times for mechanical switches used on electronic devices may increase with hardware degradation and usage over time. Firmware and software solutions may prevent multiple signal readings or switch activations over the expected switch bounce time.

According to various embodiments, wear of the device over time may be taken into account. Various embodiments may take hardware degradation into consideration and may adjust debounce times for susceptible devices as required.

According to various embodiments, the debounce time may take into consideration the wear of the hardware over time, which may avoid that a wrong bounce is registered by the system. Having a high debounce time set from the start may not be desirable since it may lead the device to reject switch closures that were intended by the user, if done so rapidly.

According to various embodiments, a system to increase the set debounce times to account for hardware degradation may be provided.

According to various embodiments, an automatic debounce method (for example software) may be provided.

According to various embodiments, click customization using magnetic repulsion may be provided.

According to various embodiments, adjustable debounce times may account for hardware degradation FIG. 1 shows a device 100 according to various embodiments. The device 100 may include a switch 102. The device 100 may further include a memory 104 configured to store information indicating a debounce time. The device 100 may further include a switch closed determination circuit 106 configured to determine whether the switch 102 is depressed based on the debounce time. The device 100 may further include an age compensation circuit 108 configured to update the debounce time based on an age of the device 100. The switch 102, the memory 104, the switch closed determination circuit 106, and the age compensation circuit 108 may be coupled with each other, like indicated by line 110, for example electrically coupled, for example using a line or a cable, and/or mechanically coupled.

In other words, a device may be provided wherein debouncing may be adjusted to an age of the device by varying a debounce time.

According to various embodiments, the switched closed determination circuit 106 may be configured to determine multiple activations of the switch 102 within the debounce time as a single activation (of the switch).

According to various embodiments, the switched closed determination circuit 106 may be configured to disregard subsequent activations of the switch 102 within the debounce time after an initial activation of the switch 102.

According to various embodiments, the age of the device 100 may include or may be a time since first operation of the device 100.

According to various embodiments, the age compensation circuit 108 may be configured to update the debounce time if the time since first operation of the device 100 is higher than a usage time threshold.

According to various embodiments, the age of the device 100 may include or may be a number of activations of the switch 102.

According to various embodiments, the age compensation circuit 108 may be configured to update the debounce time if number of activations of the switch 102 is higher than a activation number threshold.

According to various embodiments, the age compensation circuit 108 may be configured to update the debounce time based on an age of the device 100 to a pre-determined updated debounce time.

According to various embodiments, the age compensation circuit 108 may be configured to update the debounce time based on an age of the device 100 to an updated debounce time provided via a network connection.

According to various embodiments, after the age compensation circuit 108 has updated the debounce time to an updated debounce time, the switch closed determination circuit 106 may be configured to determine whether the switch 102 is depressed based on the updated debounce time.

Figure 2:
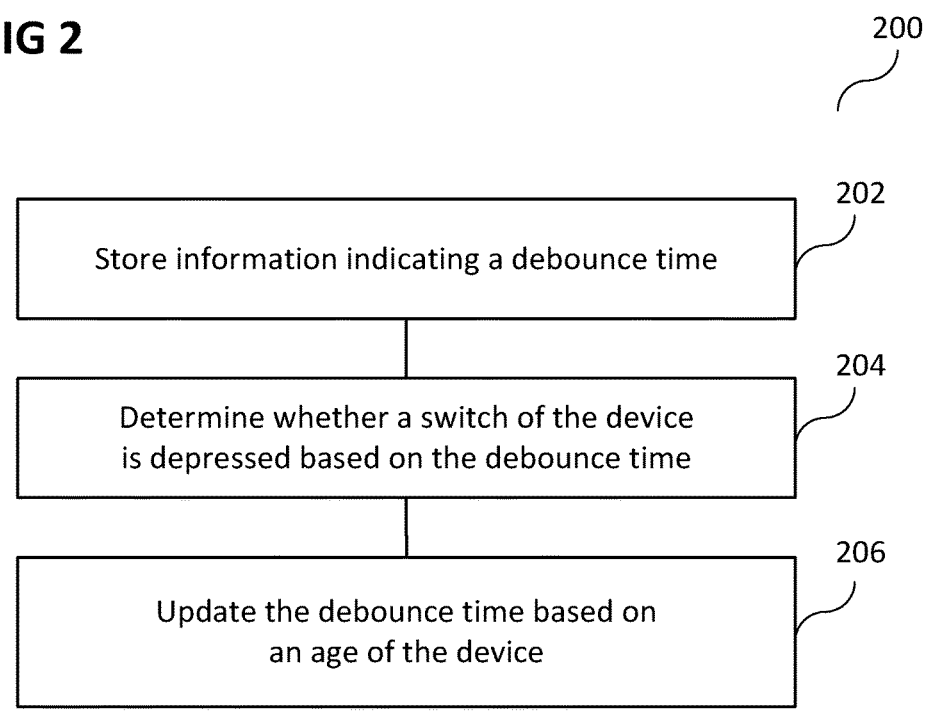
FIG. 2 shows a flow diagram illustrating a method for controlling a device according to various embodiments.

FIG. 2 shows a flow diagram 200 illustrating a method for controlling a device according to various embodiments. In 202, information indicating a debounce time may be stored. In 204, it may be determined whether a switch of the device is depressed based on the debounce time. In 206, the debounce time may be updated based on an age of the device.

According to various embodiments, the method may further include determining multiple activations of the switch within the debounce time as a single activation.

According to various embodiments, the method may further include disregarding subsequent activations of the switch within the debounce time after an initial activation of the switch.

According to various embodiments, the age of the device may include or may be a time since first operation of the device.

According to various embodiments, the method may further include updating the debounce time if the time since first operation of the device is higher than a usage time threshold.

According to various embodiments, the age of the device may include or may be a number of activations of the switch.

According to various embodiments, the method may further include updating the debounce time if number of activations of the switch is higher than a activation number threshold.

According to various embodiments, the method may further include updating the debounce time based on an age of the device to a pre-determined updated debounce time.

According to various embodiments, the method may further include updating the debounce time based on an age of the device to an updated debounce time provided via a network connection.

According to various embodiments, after the debounce time has been updated to an updated debounce time, it may be determined whether the switch is depressed based on the updated debounce time.

According to various embodiments, a computer-readable medium may be provided. The computer-readable medium may include instructions which, when executed by a computer, make the computer perform a method for controlling a device. The method may include: storing information indicating a debounce time; determining whether a switch of the device is depressed based on the debounce time; and updating the debounce time based on an age of the device.

According to various embodiments, the computer-readable medium may further include instructions which, when executed by a computer, make the computer perform determining multiple activations of the switch within the debounce time as a single activation.

According to various embodiments, the computer-readable medium may further include instructions which, when executed by a computer, make the computer perform disregarding subsequent activations of the switch within the debounce time after an initial activation of the switch.

According to various embodiments, the age of the device may include or may be a time since first operation of the device.

According to various embodiments, the computer-readable medium may further include instructions which, when executed by a computer, make the computer perform updating the debounce time if the time since first operation of the device is higher than a usage time threshold.

According to various embodiments, the age of the device may include or may be a number of activations of the switch.

According to various embodiments, the computer-readable medium may further include instructions which, when executed by a computer, make the computer perform updating the debounce time if number of activations of the switch is higher than a activation number threshold.

According to various embodiments, the computer-readable medium may further include instructions which, when executed by a computer, make the computer perform updating the debounce time based on an age of the device to a pre-determined updated debounce time.

According to various embodiments, the computer-readable medium may further include instructions which, when executed by a computer, make the computer perform updating the debounce time based on an age of the device to an updated debounce time provided via a network connection.

According to various embodiments, after the debounce time has been updated to an updated debounce time, it may be determined whether the switch is depressed based on the updated debounce time.

According to various embodiments, the failure of debounce mechanisms may be addressed to take into account the wear of the hardware over time and repeated usage, leading to unintended switch actuations.

Various embodiments may be applied to any devices that use any kind of switches that are susceptible to contact bounce or chatter, and have firmware and/or software support. These devices may include: computer mice/tracking devices, keyboards/keypads, controllers (for example wired or wireless) for computers/consoles or smartphones, smartphones/smart watches and other portable devices/wearables, speakers/headphones and/or audio devices.

According to various embodiments, the device may or may not have a default debounce time built into its firmware or software, to regulate switch bounce.

According to various embodiments, in order to determine the wear of the device, the following may be used:

Based on number of total switch activations: A counter may be built into the firmware or software, which counts how many times the switch has been pressed over the lifetime of the product, as long as the product is powered on.

Average age of the device: From the time from the product is first used, the age of the product is kept track of. This may also take into account the frequency of usage of the device by the average user.

According to various embodiments, when the device reaches a threshold value of either the total number of switch counts or age of the device, the debounce time for the device may be increased. This may be done through different ways, including: Automatic increase in the debounce time programmed into the firmware or the software, or, if the device has access to the internet, the device may send a request for a firmware or software update over the internet which has the increased debounce time built in.

According to various embodiments, the amount of time to be added to the device may be determined by any one or more of the following:

Finding the relationship between number of switch/key presses and debounce time in a testing environment for the entire switch lifecycle, or by extrapolating based on a certain number of readings;

If the device has been in the market for a while, the relationship between the debounce times and the age of the device may be determined by analyzing devices that may have been reported to have switch bounce and the debounce time needed to correct them;

Another way to determine debounce time may be to measure the least time it takes for the switches on the device to be actuated intentionally by human hand, and adding a buffer to account for exceptions. Taking into account this maximum value, the debounce time at different stages of the product's lifecycle may be obtained.

According to various embodiments, it may be ensured that unintended switch actuations (in other words: switch bounces) do not happen at any point in the lifecycle of the product.

According to various embodiments, scenarios where the debounce times may be set too high for a new device, leading to rejections of legitimate rapid key presses, may be avoided.

Various embodiments may be applied easily to all devices which have firmware and/or software control.

Various embodiments may be applied in devices in which any kind of switch is present on the device which could be susceptible to switch bounce.

Devices according to various embodiments may be controlled through firmware and/or software.

The following examples pertain to further embodiments.

Example 1 is a device comprising: a switch; a memory configured to store information indicating a debounce time; a switch closed determination circuit configured to determine whether the switch is depressed based on the debounce time; and an age compensation circuit configured to update the debounce time based on an age of the device.

In example 2, the subject-matter of example 1 can optionally include that the switched closed determination circuit is configured to determine multiple activations of the switch within the debounce time as a single activation.

In example 3, the subject-matter of any one of examples 1 to 2 can optionally include that the switched closed determination circuit is configured to disregard subsequent activations of the switch within the debounce time after an initial activation of the switch.

In example 4, the subject-matter of any one of examples 1 to 3 can optionally include that the age of the device comprises a time since first operation of the device.

In example 5, the subject-matter of any one of examples 1 to 4 can optionally include that the age compensation circuit is configured to update the debounce time if the time since first operation of the device is higher than a usage time threshold.

In example 6, the subject-matter of any one of examples 1 to 5 can optionally include that the age of the device comprises a number of activations of the switch.

In example 7, the subject-matter of example 6 can optionally include that the age compensation circuit is configured to update the debounce time if number of activations of the switch is higher than a activation number threshold.

In example 8, the subject-matter of any one of examples 1 to 7 can optionally include that the age compensation circuit configured to update the debounce time based on an age of the device to a pre-determined updated debounce time.

In example 9, the subject-matter of any one of examples 1 to 8 can optionally include that the age compensation circuit configured to update the debounce time based on an age of the device to an updated debounce time provided via a network connection.

In example 10, the subject-matter of any one of examples 1 to 9 can optionally include that, after the age compensation circuit has updated the debounce time to an updated debounce time, the switch closed determination circuit is configured to determine whether the switch is depressed based on the updated debounce time.

Example 11 is a method for controlling a device, the method comprising: storing information indicating a debounce time; determining whether a switch of the device is depressed based on the debounce time; and updating the debounce time based on an age of the device.

In example 12, the subject-matter of example 11 can optionally include determining multiple activations of the switch within the debounce time as a single activation.

In example 13, the subject-matter of any one of examples 11 to 12 can optionally include disregarding subsequent activations of the switch within the debounce time after an initial activation of the switch.

In example 14, the subject-matter of any one of examples 11 to 13 can optionally include that the age of the device comprises a time since first operation of the device.

In example 15, the subject-matter of example 14 can optionally include updating the debounce time if the time since first operation of the device is higher than a usage time threshold.

In example 16, the subject-matter of any one of examples 11 to 15 can optionally include that the age of the device comprises a number of activations of the switch.

In example 17, the subject-matter of example 16 can optionally include updating the debounce time if number of activations of the switch is higher than a activation number threshold.

In example 18, the subject-matter of any one of examples 11 to 17 can optionally include updating the debounce time based on an age of the device to a pre-determined updated debounce time.

In example 19, the subject-matter of any one of examples 11 to 18 can optionally include updating the debounce time based on an age of the device to an updated debounce time provided via a network connection.

In example 20, the subject-matter of any one of examples 11 to 19 can optionally include that, after the debounce time has been updated to an updated debounce time, it is determined whether the switch is depressed based on the updated debounce time.

Example 21 is a computer-readable medium comprising instructions which, when executed by a computer, make the computer perform a method for controlling a device, the method comprising: storing information indicating a debounce time; determining whether a switch of the device is depressed based on the debounce time; and updating the debounce time based on an age of the device.

In example 22, the subject-matter of example 21 can optionally include instructions which, when executed by a computer, make the computer perform: determining multiple activations of the switch within the debounce time as a single activation.

In example 23, the subject-matter of any one of examples 21 to 22 can optionally include instructions which, when executed by a computer, make the computer perform: disregarding subsequent activations of the switch within the debounce time after an initial activation of the switch.

In example 24, the subject-matter of any one of examples 21 to 23 can optionally include that the age of the device comprises a time since first operation of the device.

In example 25, the subject-matter of example 24 can optionally include instructions which, when executed by a computer, make the computer perform: updating the debounce time if the time since first operation of the device is higher than a usage time threshold.

In example 26, the subject-matter of any one of examples 21 to 25 can optionally include that the age of the device comprises a number of activations of the switch.

In example 27, the subject-matter of example 26 can optionally include instructions which, when executed by a computer, make the computer perform: updating the debounce time if number of activations of the switch is higher than a activation number threshold.

In example 28, the subject-matter of any one of examples 21 to 27 can optionally include instructions which, when executed by a computer, make the computer perform: updating the debounce time based on an age of the device to a pre-determined updated debounce time.

In example 29, the subject-matter of any one of examples 21 to 28 can optionally include instructions which, when executed by a computer, make the computer perform: updating the debounce time based on an age of the device to an updated debounce time provided via a network connection.

In example 30, the subject-matter of any one of examples 21 to 29 can optionally include that, after the debounce time has been updated to an updated debounce time, it is determined whether the switch is depressed based on the updated debounce time.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A device comprising:
a depressable switch;
a memory configured to store information indicating a debounce time and is coupled with the switch;
a switch closed determination circuit configured to determine whether the switch is depressed based on the debounce time and is coupled with the memory, wherein multiple depressings of the switch within the debounce time are deemed to be a single activation; and an age compensation circuit configured to update the debounce time based on an age of the device and is coupled with the memory.

2. The device of claim 1, wherein the age of the device comprises a time since first operation of the device.

3. The device of claim 2, wherein the age compensation circuit is configured to update the debounce time if the time since first operation of the device is higher than a usage time threshold.

4. The device of claim 1, wherein the age of the device comprises a number of activations of the switch.

5. The device of claim 4, wherein the age compensation circuit is configured to update the debounce time if the number of activations of the switch is higher than an activation number threshold.

6. The device of claim 1, wherein the age compensation circuit configured to update the debounce time based on an age of the device to a pre-determined updated debounce time.

7. The device of claim 1, wherein the age compensation circuit configured to update the debounce time based on an age of the device to an updated debounce time provided via a network connection.

8. The device of claim 1, wherein, after the age compensation circuit has updated the debounce time to an updated debounce time, the switch closed determination circuit is configured to determine whether the switch is depressed based on the updated debounce time.

9. A method for controlling a device having a switch, the method comprising:
storing information indicating a debounce time for the switch;

determining whether the switch is activated based on the debounce time, wherein multiple depressings of the switch within the debounce time are deemed to be a single activation;

monitoring the activations of the switch; and updating the debounce time for the switch based on an age of the device.

10. The method of claim 9, wherein the age of the device comprises a time since first operation of the device.

11. The method of claim 10, further comprising:
updating the debounce time if the time since a first operation of the device is higher than an usage time threshold.

12. The method of claim 9, wherein the age of the device comprises a number of activations of the switch.

13. The method of claim 12, further comprising:
updating the debounce time if the number of activations of the switch is higher than an activation number threshold.

14. The method of claim 9, further comprising:
updating the debounce time to a pre-determined updated debounce time.

15. The method of claim 9, further comprising:
updating the debounce time to an updated debounce time provided via a network connection in response to a request for the updated debounce time.

16. A computer-readable medium comprising instructions which, when executed by a computer, make the computer perform a method for controlling a device having a switch, the method comprising:
storing information indicating a debounce time for the switch;

determining whether the switch of the device is activated based on the debounce time, wherein multiple depressings of the switch within the debounce time are deemed to be a single activation; and updating the debounce time for the switch based on an age of the device.

* * * * *